United States Patent [19]

Laukien et al.

[11] 4,246,537
[45] Jan. 20, 1981

[54] SPIN RESONANCE SPECTROMETER

[75] Inventors: Günther R. Laukien; Toni Keller, both of Rheinstetten-Forchheim; Dieter Koch, Ettlingen, all of Fed. Rep. of Germany; Werner Tschopp, Zürich-Fällanden, Switzerland

[73] Assignee: Spectrospin AG, Zürich, Switzerland

[21] Appl. No.: 960,788

[22] Filed: Nov. 15, 1978

[30] Foreign Application Priority Data

Nov. 18, 1977 [DE] Fed. Rep. of Germany ....... 2751521
Oct. 21, 1978 [DE] Fed. Rep. of Germany ....... 2845961

[51] Int. Cl.³ ............................................ G01N 27/00
[52] U.S. Cl. ..................................... 324/321; 324/318
[58] Field of Search .......................................... 324/321

[56] References Cited

U.S. PATENT DOCUMENTS 3,746,971  7/1973  Storey .................................. 324/321

Primary Examiner—Michael J. Tokar

[57] ABSTRACT

A spin resonance spectrometer having a sample vessel 83 for containing substances to be examined. Pipes 92, 93 for the supply and discharge of test substances and possibly rinsing media are connected to the sample vessel, the pipe serving for supplying substances being connected to the sample vessel 83 such that the direction of movement of the substance supplied, on entering the sample vessel 83, has a component directed tangentially with respect to the sample vessel. As a result the supplied substance rotates in the sample vessel. The supply pipe 92, 93 may open substantially tangentially into the sample vessel 83, or a connecting member 184 comprising at least approximately helical channels may be located between the pipe 192 and the sample vessel 183.

10 Claims, 8 Drawing Figures

SPIN RESONANCE SPECTROMETER

The invention relates to a spin resonance spectrometer comprising a sample vessel for containing substances to be examined, and pipes connected to the ends of the sample vessel for the supply and discharge of media in the form of test substances or possibly rinsing media.

A spin resonance spectrometer of this type is known from U.S. Pat. No. 2,955,252. This known spin resonance spectrometer serves for measuring samples which are supplied and discharged periodically through the pipes connected to the sample vessel. In this known spin resonance spectrometer however one cannot be sure that the samples are completely homogeneous inside the sample vessel, so that significant measuring errors can easily occur particularly when it is desired to make accurate high resolution measurements.

It is known for example from German Offenlegungsschrift No. 20 04 973, to set sample vessels in high speed rotation about their longitudinal axis, in order to average out variations in measurements being made as a result of inhomogeneity in the test substance in the measuring region. This ensures accurate measurement results. In the spectrometer mentioned at the beginning of this specification however the permanent connection between the pipes and the sample vessel, which in the simplest case can be formed by a dielectric pipe section, makes rotation of the sample vessel impossible.

Accordingly, it is an object of the present invention to provide a nuclear spin resonance spectrometer having a stationary sample vessel in which errors due to inhomogeneity of the test substance are eliminated.

According to the invention there is provided a spin resonance spectrometer comprising a sample vessel for containing substances to be examined, and pipes connected to the ends of the sample vessel for the supply and discharge of media, characterised in that one said pipe which serves for the supply of media is connected to the sample vessel such that the direction of movement of the supplied media on entering the sample vessel has a component directed tangentially with respect to the sample vessel, whereby the supplied media rotates in the sample vessel.

Thus, in the spectrometer according to the invention the sample vessel with the substance is not set in rotation, but the substance is set in rotation directly in the sample vessel. Use is made of the fact that the substance is usually introduced into the sample vessel and guided therethrough at considerable speed, so that it is possible to impart a rotary movement to the substance in the sample vessel by guiding the latter tangentially.

In one embodiment of the invention, at least one pipe serving to supply substances opens into the sample vessel substantially tangentially. If it is intended to mix two or more substances in the sample vessel, good turbulence and thus mixing of the substances in the sample vessel can be achieved in this way. To supply several substances, two or more pipes can be arranged coaxially with respect to each other in the region in which they open into the sample vessel. However, it will also be possible to allow two or more pipes to open into the sample vessel in the same plane, distributed over the periphery of the sample vessel.

In the afore-described embodiment, one pipe section must extend at least approximately in a plane at right-angles to the axis of the sample vessel. When space is restricted, an arrangement of this type may be unfavourable. Therefore, in another embodiment of the invention, a connecting member comprising at least approximately helical channels is located between the pipe and the sample vessel, the pipe being arranged substantially axially with respect to the sample vessel.

Thus, in this embodiment, the pipe serving to supply substances is not connected directly tangentially to the sample vessel, but the substance is supplied axially to the sample vessel via channels upstream of the sample vessel which impart to the substance the tangential component of movement which ensures a rotation of the substance in the sample vessel.

The helical channels may be formed for example by recesses in and/or elevations on the surface of a wall of the connecting member. In such a case, the connecting piece may be formed in a simple manner by a grooved or ribbed and twisted section of pipe. However, there is also the possibility that the channels are formed by bores in the connecting member. Even if these bores are rectilinear, if they are located in suitably inclined positions, it is possible that they can be regarded as at least approximately helical channels.

Inter alia, the invention provides the possibility of examining a test substance as it passes, i.e. as it moves, during which the turbulence leads to thorough mixing of the substance itself and thus to good homogeneity in the measuring region. Furthermore, the examination of the test substance as it travels, for example in the case of NMR spectroscopic examination, may facilitate a simple measurement of the relaxation $T1$.

The spin resonance spectrometer according to the invention is suitable for example for being connected to a chromatograph, so that an automatic supply and discharge of the fractions separated by the chromatograph to or from the sample vessel can take place. In a high pressure chromatograph, liquids at high pressure are available, which can be supplied directly to the sample vessel. The pressure is sufficient to ensure a rotation of the test substance by tangential introduction into the sample vessel. Therefore, in many cases, it is sufficient if devices are provided which bring about the direct passage of the fractions separated by the chromatograph, through the sample vessel.

Embodiments of the invention will now be described in detail by way of example with reference to the accompanying drawings, in which.

Figure 1:
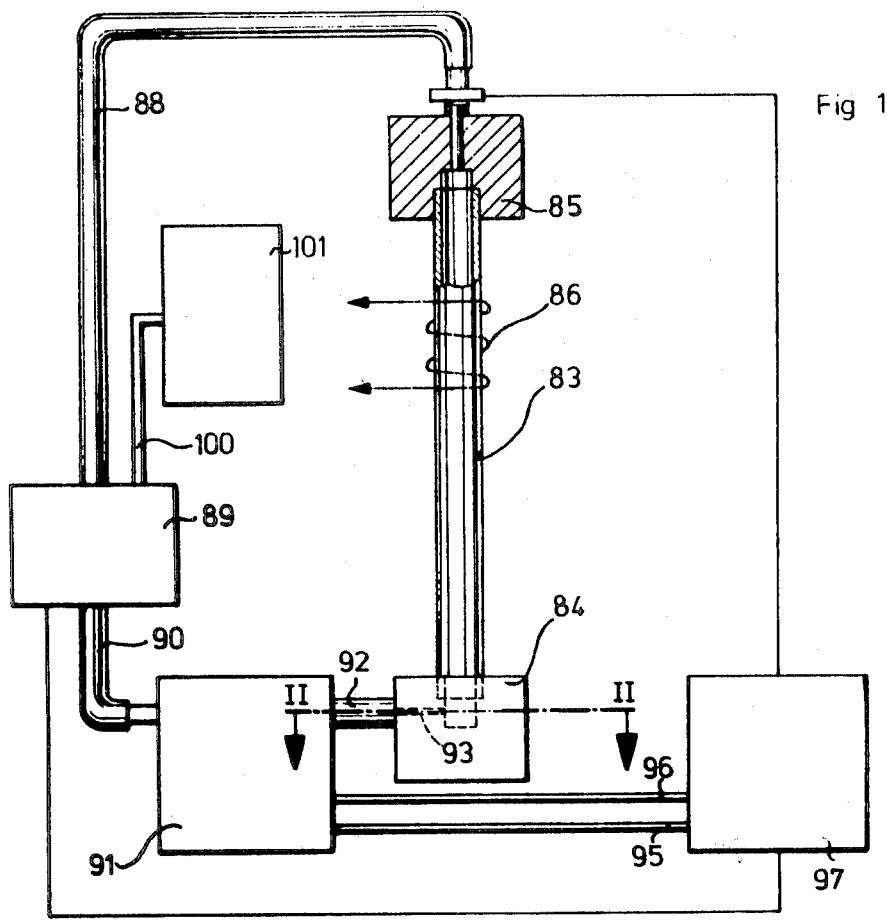
FIG. 1 is a diagrammatic illustration of the sample vessel arrangement of a spin resonance spectrometer according to the invention in conjunction with a device for changing test substances.
Figure 2:
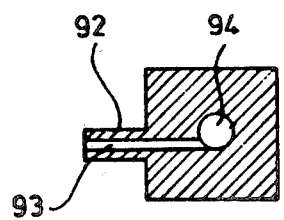
FIG. 2 is a section along the line II—II of FIG. 1.

The arrangement illustrated in FIGS. 1 and 2 comprises a sample vessel 83 of a nuclear resonance spectrometer of known construction. The sample vessel 83 is in the form of a glass tube the ends of which are inserted in two connecting blocks 84 and 85. The connecting blocks 84 and 85 are connected to supporting components of the spectrometer in a manner which is not shown in detail. A coil 86 surrounds the sample vessel 83 in the region between the two blocks 84 and 85. The upper block 85 is provided with a connection 87 in alignment with the axis of the sample vessel 83, from which a pipe 88 leads to devices 89 for supplying and/or discharging test substances and possibly rinsing media. The devices 89 comprise the necessary containers for test substances and rinsing media, pipes and valves as well as pumps or other pressure sources, which are necessary in order to introduce substances into the sample vessel 83 up to the level of the coil 86. The devices 89 are controlled by control commands given manually or automatically to discharge the substances after recording the spectrum, or to pass the substances continuously through the sample vessel 83. Thus, the direction of the supply and discharge can be selected at will by using excess and reduced pressure.

A second pipe 90 leads from the devices 89 to a heat-exchanger 91, which is connected by pipes 95 and 96 to a temperature control unit 97 and is connected by way of a pipe 92 to the lower block 84. As can be seen in FIG. 2, the pipe 92 is arranged such that its bore 93 opens tangentially into a bore 94 which adjoins the lower end of the sample vessel 83. If a test substance is conveyed through the pipe 92 at sufficient speed into the sample vessel 83, then due to the tangential entry into the sample vessel, the test substance receives a tangential component of movement with respect to the sample vessel which has the result that the test substance carries out a rotation inside the sample vessel. It is thus possible to achieve good homogeneity of the sample in the measuring region, without a rotation of the sample vessel itself being necessary for this purpose.

In a particularly simple manner, the tangential arrangement of the supply pipe provides the possibility of allowing several pipes to open into the sample vessel in the same plane, in order to supply several substances at the same time, which substances are immediately mixed very well due to the induced rotary movement.

In the embodiment illustrated, the devices 89 for supplying and/or discharging test substances and possibly rinsing media are connected to a chromatograph 101 by way of pipes 100 shown diagrammatically. The devices 89 are in this case constructed such that they bring about the direct passage of the fractions separated by the chromatograph 101 through the sample vessel 83.

Figure 3:
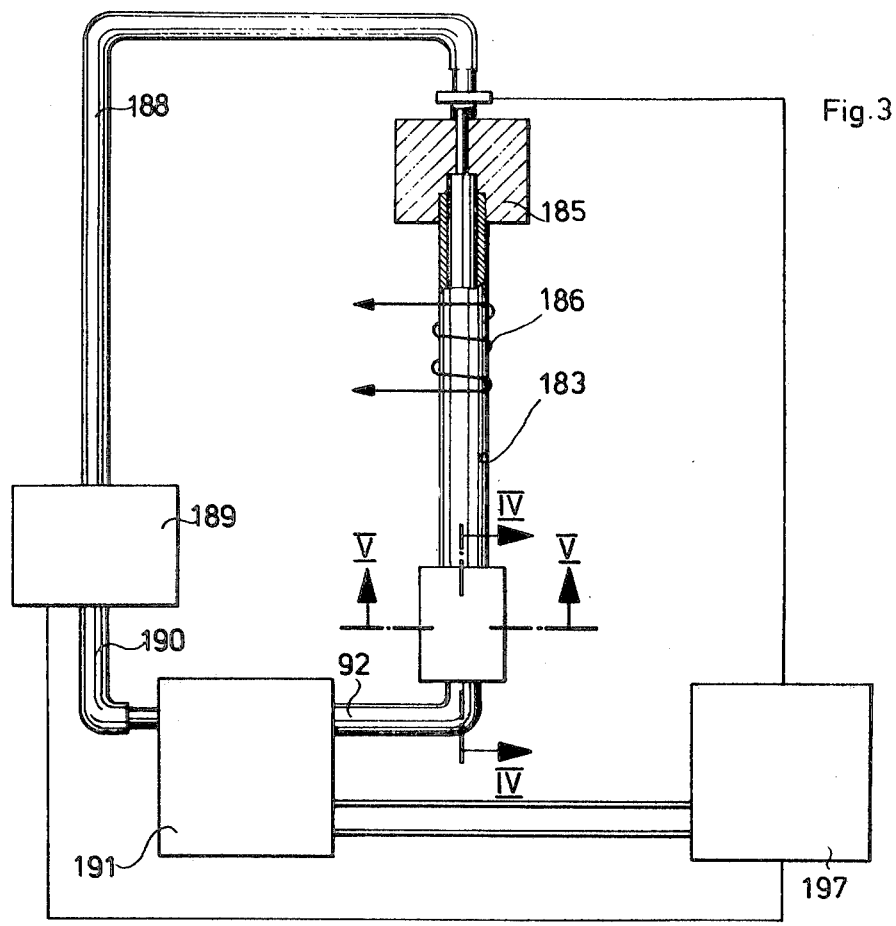
FIG. 3 is a diagrammatic illustration of the sample vessel arrangement of a further spin resonance spectrometer according to the invention in conjunction with a devise for changing test substances.
Figure 4:
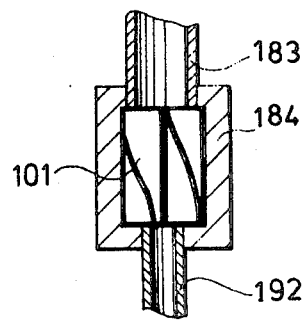
FIG. 4 is a section on the line IV—IV of FIG. 3.
Figure 5:
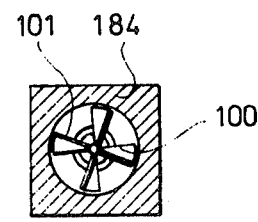
FIG. 5 is a section on the line V—V of FIG. 3.

In the embodiment of the invention illustrated in FIGS. 3 to 5, the sample vessel 183 consists of a glass tube, the ends of which are inserted in two connecting blocks 184 and 185. The connecting blocks 184 and 185 are connected in a manner which is not shown in detail to supporting components of the spectrometer. A coil 186 surrounds the sample vessel 183 in the region between the two blocks 184 and 185. The upper block 185 is provided with a connection 187 in alignment with the axis of the sample vessel 183, from which a pipe 188 leads to devices 189 serving for supplying and/or discharging test substances and possibly rinsing media. A second pipe 190 leads from the devices 189 to a heat-exchanger 191 which is connected by way of a pipe 192 to the lower connecting block 184. As can be seen in FIGS. 4 and 5, the connecting block 184 contains a chamber 100 in which an insert 101 with spiral-shaped deflectors is located. If a test substance is conveyed through the pipe 192 at sufficient speed into the sample vessel 183, then the test substance is set in rotation by the deflectors of the insert 101 which impart to the substance a tangential component of movement with respect to the sample vessel. It is thus possible to achieve good homogeneity of the sample in the measuring region. In this case, it would also be possible to connect several pipes coaxially with respect to each other or side-by-side to the connecting block 184 in order to be able to supply several substances simultaneously, which are then immediately mixed very well by the rotary movement induced by means of the insert 101.

Figure 6:
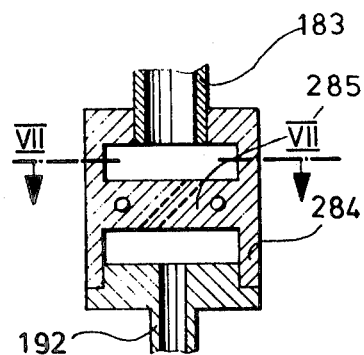
FIG. 6 is a section similar to FIG. 4 through another embodiment of a connecting member which can be used in the arrangement according to FIG. 3.
Figure 7:
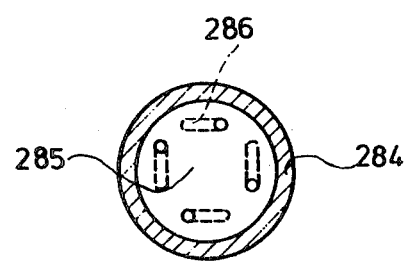
FIG. 7 is a section on line VII—VII through the connecting member according to FIG. 6.

In the embodiment of the invention illustrated in FIGS. 6 and 7, a lower connecting block 284, into which the sample vessel 183 opens from above and the pipe 192 from below, comprises a transverse wall 285 which is provided with obliquely inclined bores 286. On account of their position, these rectilinear bores can be regarded as sections of spirals, so that these bores thus form approximately helical channels through which the substance supplied to the test tube 183 must be forced. There is thus imparted to this substance a component of movement directed tangentially with respect to the test tube 183, by which component the substance introduced into the sample vessel 183 is set in rotation to ensure homogenisation of the substance in the measuring region.

Figure 8:
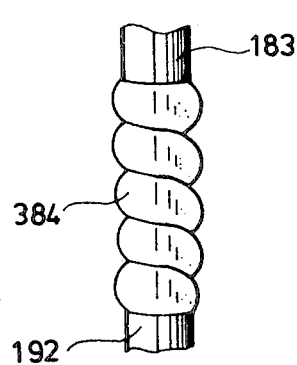
FIG. 8 is a view of a twisted piece of pipe which can be used in place of the connecting member in the arrangement according to FIG. 3.

As shown in FIG. 8, a connecting piece in the form of a twisted pipe section 384 can be used in place of a connecting block 184. The section 384 is joined to both the pipe 192 coming from the heat-exchanger 191 as well as the sample vessel 183. The section of pipe 384 may also consist of glass for example, like the pipe 192 and the sample vessel 183, and can be constructed in one piece with the latter. The pipe section 384 has a cross sectional shape such that due to the twisting on its inner wall surface, helical recesses and/or elevations are formed, which act as deflectors thus imparting to the substance supplied a component of movement tangential with respect to the sample vessel 183 and consequently imparting a rotation thereto.

It will be understood that the invention is not limited to the embodiments illustrated, but that it is possible for a man skilled in the act to give the connecting blocks and connecting pieces a variety of different shapes, which all have the same effect, namely of setting a substance passing therethrough in rotation. Thus, the shape and cross section of the helical channels may depend both on the type of substances to be supplied as well as on the pressure and the speed of flow, at which these substances are supplied.

We claim:

1. A spin resonance spectrometer comprising:
   a stationary sample vessel;
   means for introducing a flowable test substance into said sample vessel and for discharging the test substance therefrom;
   stationary guide means adjacent said sample vessel for imparting to the test substance prior to introduction of same into said sample vessel a tangential component of movement relative to the longitudinal axis of the sample vessel;
   and means for applying nuclear magnetic resonance to the test substance within said sample vessel.

2. A spectrometer according to claim 1, wherein said test substance introduction means comprises at least one pipe positioned substantially axially relative to said sample vessel and a connecting member in communication with one end of said sample vessel, said at least one pipe communicating with said sample vessel via said connecting member.

3. A spectrometer according to claim 2, wherein said stationary guide means is provided in said connecting member.

4. A spectrometer according to claim 3, wherein said connecting member includes a chamber therein and said stationary guide means comprises at least one spiral deflection positioned within said chamber.

5. A spectrometer according to claim 3, wherein said connecting member includes a chamber therein and a transverse wall thereacross, a plurality of bores being formed in said transverse wall communicating with the chamber on the opposed sides of said wall, each of said bores being inclined relative to the plane of the wall so as to constitute segments of helical channels.

6. A spectrometer according to claim 5, comprising four of said bores each of which is offset substantially 90° from the next adjacent bores.

7. A spectrometer according to claim 2, wherein said connecting member comprises a section of pipe the surface of which is configured to provide at least one helically extending channel, said at least one channel comprising said stationary guide means.

8. A spectrometer according to claim 2, wherein the interior surface of said connecting member is provided with helically extending formations forming helical deflectors.

9. A spectrometer according to claim 2, including at least two of said pipes arranged coaxially relative to each other.

10. A spectrometer according to claim 1, wherein said test substance introduction means comprises at least one pipe and said stationary guide means comprises a connecting member in communication with said sample vessel, said at least one pipe being connected to said connecting member so as to introduce the test substance thereto tangentially.

* * * * *